(12) United States Patent
Tateiwa et al.

(10) Patent No.: US 7,663,228 B2
(45) Date of Patent: Feb. 16, 2010

(54) ELECTRONIC COMPONENT AND ELECTRONIC COMPONENT MODULE

(75) Inventors: Yoshihiro Tateiwa, Yamanashi (JP); Kakushi Nakagawa, Yamanashi (JP)

(73) Assignee: Eudyna Devices Inc., Yamanashi (JP)

( * ) Notice: Subject to any disclaimer, the term of this patent is extended or adjusted under 35 U.S.C. 154(b) by 325 days.

(21) Appl. No.: 11/727,487

(22) Filed: Mar. 27, 2007

(65) Prior Publication Data

US 2007/0228405 A1    Oct. 4, 2007

(30) Foreign Application Priority Data

Mar. 30, 2006   (JP) .............................. 2006-094033

(51) Int. Cl.
*H01L 23/043* (2006.01)
(52) U.S. Cl. ................ 257/709; 257/708; 257/E23.006
(58) Field of Classification Search ......... 257/708–711; 438/121
See application file for complete search history.

(56) References Cited

U.S. PATENT DOCUMENTS 5,567,972 A * 10/1996 Abe ........................... 257/433
6,091,022 A *  7/2000 Bodin ........................ 174/528

FOREIGN PATENT DOCUMENTS

JP            5-95169 A        4/1993

* cited by examiner

*Primary Examiner*—Zandra Smith
*Assistant Examiner*—Paul E Patton
(74) *Attorney, Agent, or Firm*—Westerman, Hattori, Daniels & Adrian, LLP

(57) ABSTRACT

An electronic component includes an electronic element, a conductive first base portion, a conductive second base portion, an insulator and a terminal. An electronic element is to be mounted on the electronic element mounting portion. The electronic element mounting portion is mounted on the first base portion. The insulator insulates the first base portion from the second base portion and couples the first base portion to the second base portion. The terminal is provided on the first base portion and is insulated from the first base portion.

8 Claims, 4 Drawing Sheets

ELECTRONIC COMPONENT AND ELECTRONIC COMPONENT MODULE

BACKGROUND OF THE INVENTION

1. Field of the Invention

This invention generally relates to an electronic component and an electronic component module.

2. Description of the Related Art

An electronic component for optical communication, in which a laser diode chip is mounted in a cylindrical case, is developed. The electronic component for the optical communication has a structure in which a laser diode, a laser-diode-mounting portion, a photo diode detecting an output light from the laser diode and so on are mounted on a metal base. Generally, these components are covered with a metal cap and the cap is fixed to the base.

A lead, a ground terminal and so on are coupled to the base. The lead couples the mounted components to an external component electrically. Japanese Patent Application Publication No. 5-95169 discloses an optical communication module in which the electronic components and metal components such as a lens holder, a lens guide or the like are combined.

The cap and the base of the electronic component are electrically coupled to each other, because the cap and the base are made of metal. A noise caused by Electrostatic Discharge (ESD), Electromagnetic Interference (EMI) or the like is conducted between the electronic component and an external component coupled to the electronic component.

For example, a signal for controlling the laser diode is conducted as a noise from the electronic component to other components of the module. A noise is conducted to the electronic component from other components of the module. The noise causes error of the optical communication module or breakdown of the components. The electronic component is more subjected to the noise as transmission rate is more increased. And noise suppression is more necessary.

SUMMARY OF THE INVENTION

The present invention provides an electronic component less subjected to a noise with other components and provides an electronic component module having the electronic component.

According to an aspect of the present invention, preferably, there is provided an electronic component including an electronic element mounting portion, a first base portion, a second base portion, an insulator and a terminal. An electronic element is to be mounted on the electronic element mounting portion. The electronic element mounting portion is mounted on the first base portion. The first base portion and the second base portion are conductive. The insulator insulates the first base portion from the second base portion and couples the first base portion to the second base portion. The terminal is provided on the first base portion and is insulated from the first base portion.

With the above-mentioned configuration, it is possible to limit a noise transmission from the first base portion to outside, because the first base portion is insulated from the second base portion with the insulator. It is possible to limit a transmission of an external signal to the first base portion. Accordingly, the electronic component is less subjected to a noise with other components.

According to another aspect of the present invention, preferably, there is provided an electronic component module including an electronic component and a module unit. The electronic component has an electronic element mounting portion, a first base portion, a second base portion, a terminal and an insulator. An electronic element is to be mounted on the electronic element mounting portion. The electronic element mounting portion is mounted on the first base portion. The first base portion and the second base portion are conductive. The terminal is provided on the first base portion and is insulated from the first base portion. The insulator insulates the first base portion from the second base portion and couples the first base portion to the second base portion. The module unit is directly or indirectly fixed only to the second base portion.

With the above-mentioned configuration, it is possible to limit a noise transmission from the first base portion to outside through the module unit, because the first base portion is insulated from the second base portion with the insulator. It is possible to limit a transmission of an external signal to the first base portion through the module unit. Accordingly, the electronic component module is less subjected to a noise with other components.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention.

First Embodiment

Figure 1A:
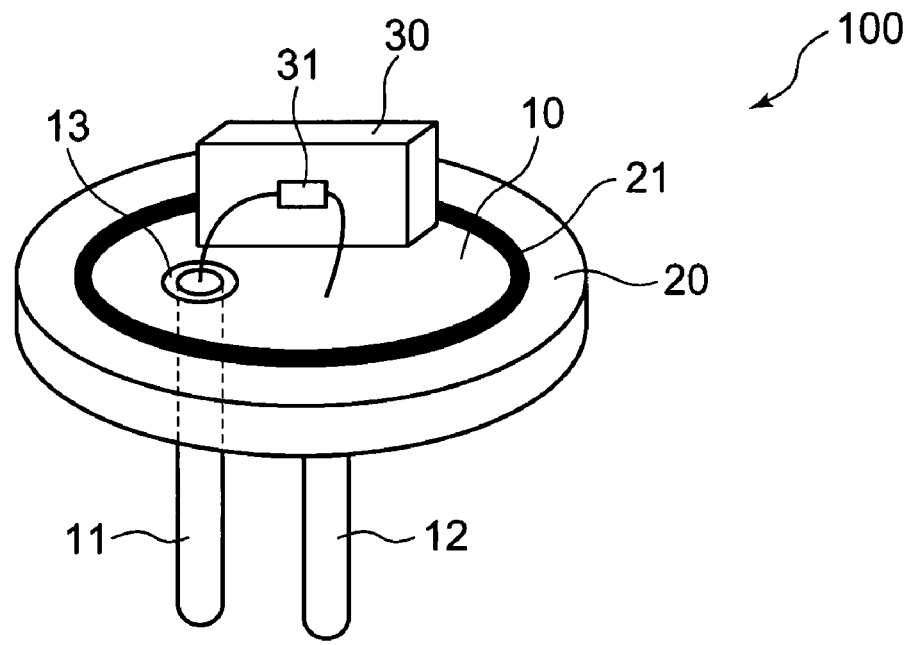
FIG. 1A and FIG. 1B illustrate an electronic component in accordance with a first embodiment of the present invention.
Figure 1B:
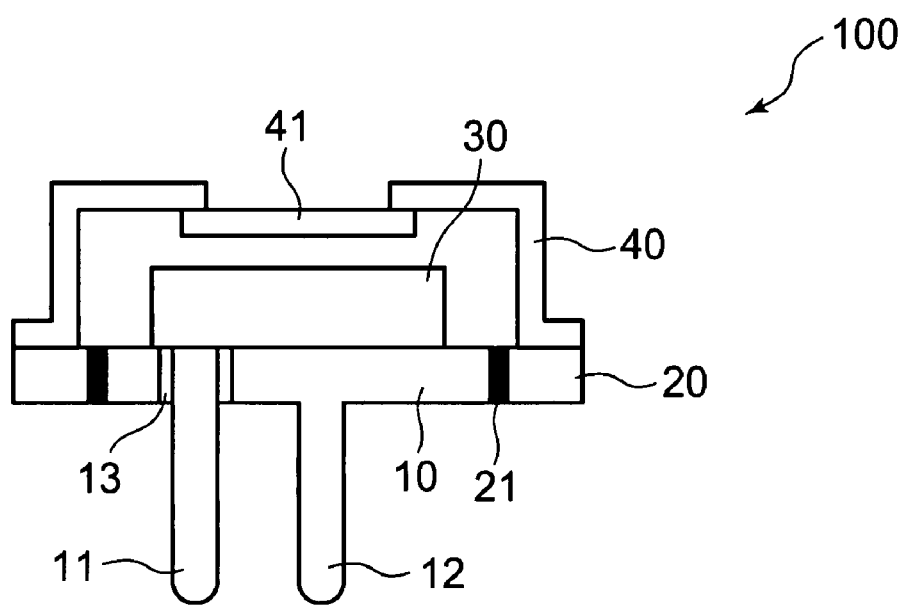

FIG. 1A and FIG. 1B illustrate an electronic component 100 in accordance with a first embodiment of the present invention. FIG. 1A illustrates a perspective view of the electronic component 100. FIG. 1B illustrates a cross sectional view of the electronic component 100. As shown in FIG. 1A and FIG. 1B, the electronic component 100 has a first base portion 10, a second base portion 20, an electronic element mounting portion 30 and a cap 40. In FIG. 1A, the cap 40 is omitted.

The first base portion 10 is a metal member having a substantially disc shape. A lead 11 and a lead 12 are provided on the first base portion 10. The lead 11 is a terminal where a signal is provided, and passes through the first base portion 10. The lead 12 is a terminal at ground potential, and is fixed to the first base portion 10. A lead-holding portion 13 is provided between the first base portion 10 and the lead 11. The lead-holding portion 13 has an insulating property. Accordingly, the first base portion 10 is electrically insulated from the lead 11. The first base portion 10 is electrically coupled to the lead 12 at ground potential. The first base portion 10 may be at a reference potential.

The second base portion 20 is a metal member having a ring shape, and surrounds a side face of the first base portion 10. An insulating ring 21 is provided between the first base portion 10 and the second base portion 20. The insulating ring 21 is made of an insulator such as glass or ceramics. Any insulator may be used for the insulating ring 21. The insulating ring 21 insulates the first base portion 10 from the second base portion 20 and fixing the first base portion 10 to the second base portion 20.

The electronic element mounting portion 30 is a member provided on the first base portion 10. A laser diode chip 31 is mounted on the electronic element mounting portion 30. One terminal of the laser diode chip 31 is coupled to the lead 11 through such as a wire. The other terminal of the laser diode chip 31 is coupled to the first base portion 10 through such as a wire and is electrically coupled to the lead 12.

The cap 40 is made of metal. The cap 40 is arranged on the second base portion 20 so as to surround the first base portion 10 and the electronic element mounting portion 30. An opening is formed in the upper face of the cap 40. The opening is filled with a transparent member 41 such as glass. The cap 40 may seal the second base portion 20 with resistance welding or YAG welding. The cap 40 may be fixed to the second base portion 20 with soldering. The cap 40 may contact to the second base portion 20 without being fixed to the second base portion 20.

Next, a description will be given of an operation of the electronic component 100. A control signal is fed into the laser diode chip 31 from the lead 11. And the laser diode chip 31 emits a laser light. The laser light from the laser diode chip 31 is emitted outside through the transparent member 41. The laser diode chip 31 is grounded through the lead 12.

In the embodiment, it is possible to restrain transmission of a noise from the first base portion 10 to the cap 40, because the first base portion 10 is insulated from the second base portion 20 with the insulating ring 21 and the cap 40 is fixed only to the second base portion 20 without contacting to the first base portion 10. The noise transmission to outside through the cap 40 is limited. And it is possible to limit a transmission of an external signal to the first base portion 10. A high frequency signal passing through the leads 11 and 12 is less subjected to the noise from outside. Accordingly, it is possible to restrain error or breakdown of the electronic component 100. Here, the term "only" means that the cap 40 is fixed to the second base portion 20 without being fixed to the first base portion 10.

Second Embodiment

Figure 2:
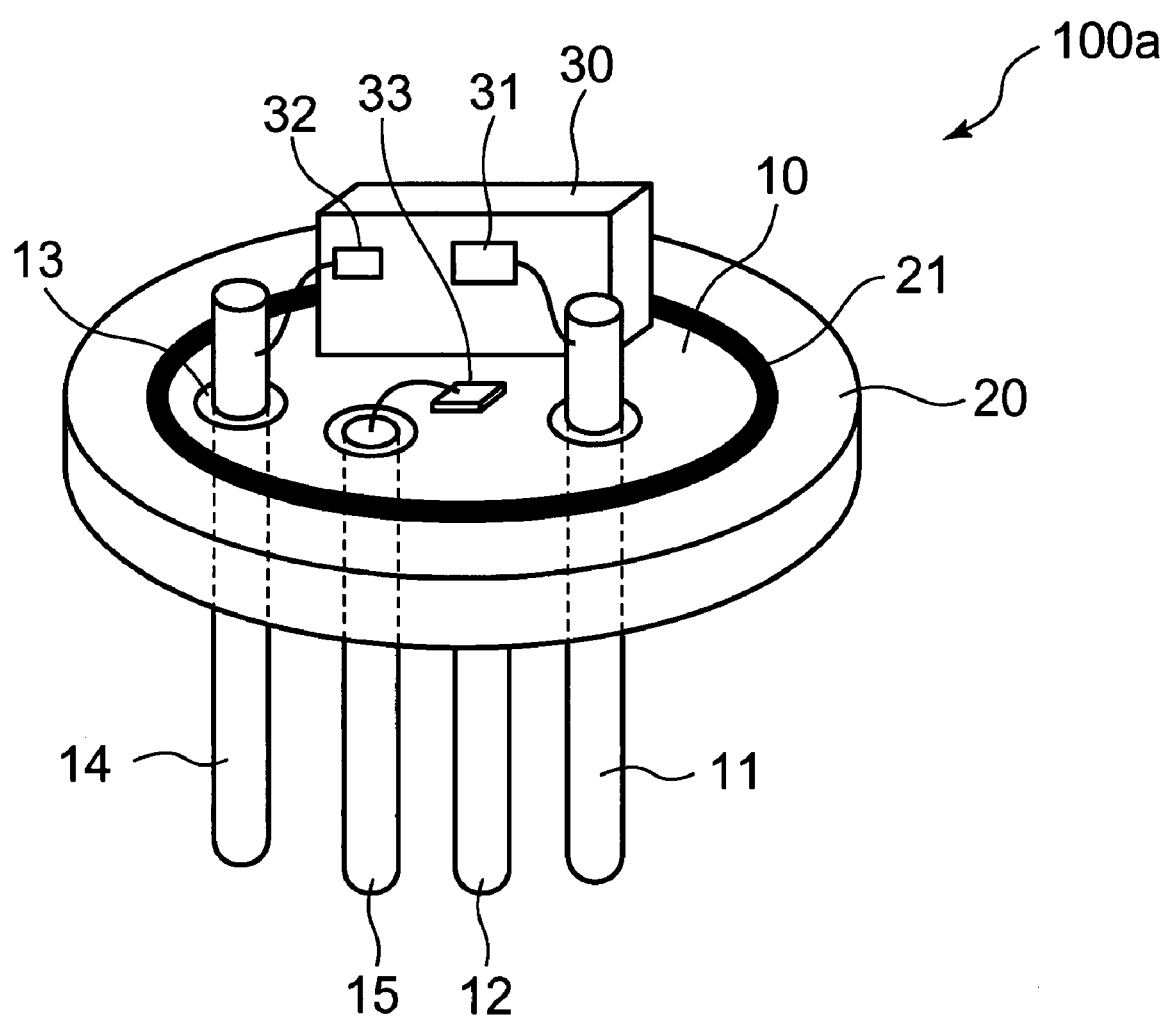
FIG. 2 illustrates a perspective view of an electronic component in accordance with a second embodiment of the present invention.

Next, a description will be given of an electronic component 100a in accordance with a second embodiment of the present invention. FIG. 2 illustrates a perspective view of the electronic component 100a. As shown in FIG. 2, the electronic component 100a has further a temperature sensor 32, a photo diode 33 and leads 14 and 15, being different from the electronic component 100 shown in FIG. 1. The same components have the same reference numerals in order to avoid a duplicated explanation. In FIG. 2, the cap 40 is omitted.

The leads 14 and 15 pass through the first base portion 10. The lead-holding portion 13 is provided between the first base portion 10 and the leads 14 and 15. Therefore, the leads 14 and 15 are electrically insulated from the first base portion 10, and the lead 14 is electrically insulated from the lead 15. The temperature sensor 32 is mounted on the electronic element mounting portion 30. The temperature sensor 32 detects a temperature of the laser diode chip 31. The photo diode 33 detects an output light of the laser diode chip 31. The photo diode 33 is arranged backward of the laser diode chip 31. In the embodiment, the photo diode 33 is mounted on the first base portion 10 below the laser diode chip 31. The first base portion 10 and the electronic element mounting portion 30 are electrically coupled to the lead 12 at a ground potential.

A terminal of the temperature sensor 32 is coupled to the lead 14 through such as a wire. A terminal of the photo diode 33 is coupled to the lead 15 though such as a wire. The laser diode chip 31, the temperature sensor 32 and the photo diode 33 are electrically coupled to the ground potential from the back face thereof respectively.

In the embodiment, it is possible to restrain transmission of a noise from the first base portion 10 to the cap 40, because the first base portion 10 is insulated from the second base portion 20 with the insulating ring 21 and the cap 40 is fixed only to the second base portion 20 without contacting to the first base portion 10. The noise transmission to outside through the cap 40 is limited. And it is possible to limit a transmission of an external signal to the first base portion 10. A high frequency signal passing through the leads 11 and 12 is less subjected to the noise from outside. Accordingly, it is possible to restrain error or breakdown of the electronic component 100a.

Third Embodiment

Next, a description will be given of an optical communication module 200 in accordance with a third embodiment of the present invention. Generally, an optical communication module has an optical communication device and a module unit. The module unit has an optical component such as a lens holder having a lens, a guide fixing a package, a fixing member such as a fixing portion of an optical component.

Figure 3:
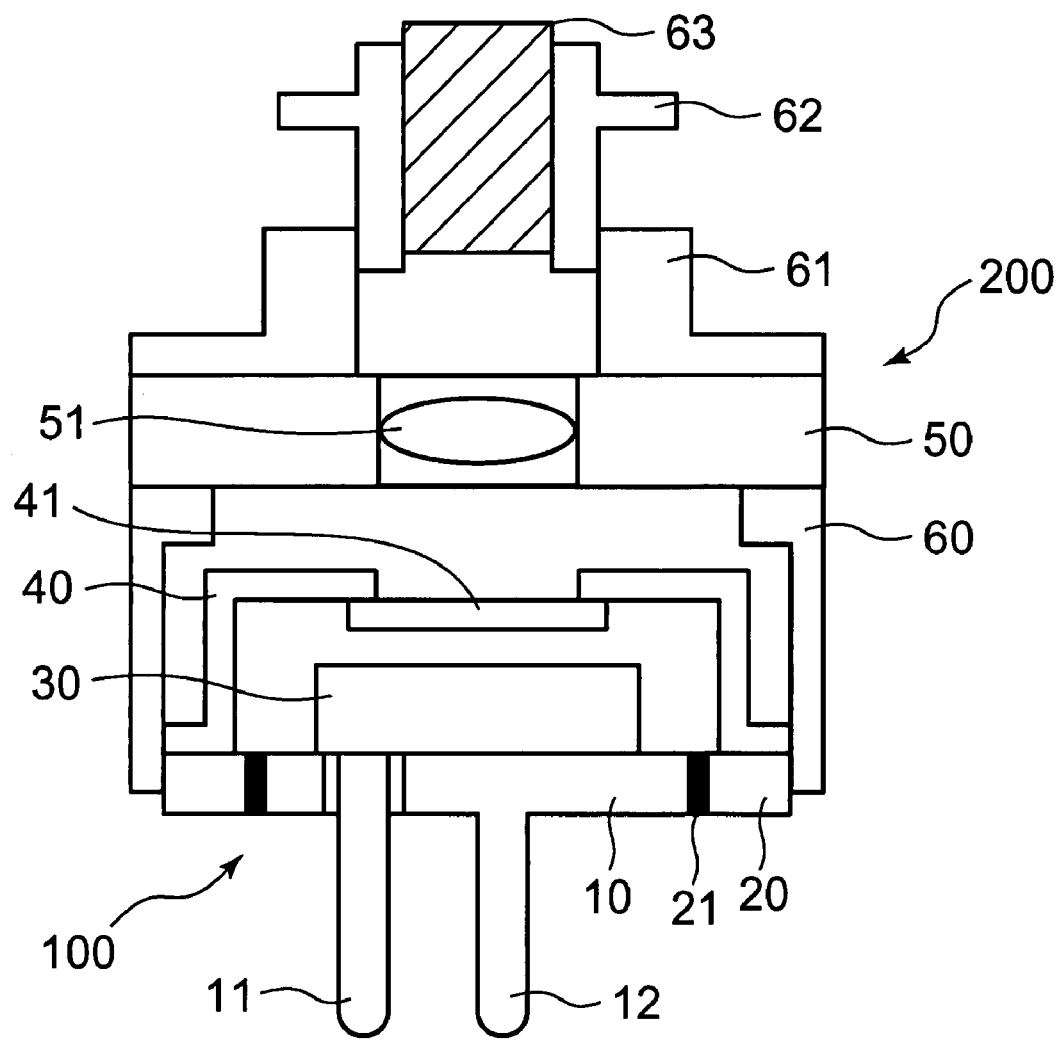
FIG. 3 illustrates a cross sectional view of an optical communication module in accordance with a third embodiment of the present invention.

FIG. 3 illustrates a cross sectional view of the optical communication module 200. As shown in FIG. 3, the optical communication module 200 has the electronic component 100 shown in FIG. 1, a lens holder 50, a fixing portion 60, a guide 61, a fiber-holding member 62 and a fiber 63. The fixing portion 60 is a metal member for fixing the lens holder 50. A lower end of the fixing portion 60 is fixed only to the second base portion 20 without contacting to the first base portion 10. An upper end of the fixing portion 60 is coupled to the lens holder 50.

The lens holder 50 is a metal member holding a lens 51. The lens 51 is arranged facing the transparent member 41. A laser light emitted from the laser diode chip 31 is emitted outside through the lens 51. It is therefore possible to optically communicate with an external device.

In the embodiment, the second base portion 20 is electrically coupled to the lens holder 50 through the fixing portion 60. In this case, when the lens holder 50 and the fixing portion 60 receive an external noise, the noise is possibly transmitted to the electronic component 100. However, it is possible to restrain transmission of a noise from the fixing portion 60 and the lens holder 50 to the electronic component 100, because the fixing portion 60 is fixed only to the second base portion 20 without contacting to the first base portion 10 and the first base portion 10 is insulated from the second base portion 20 with the insulating ring 21. The noise transmission from the electronic component 100 to outside is limited. Accordingly, it is possible to restrain error or breakdown of the optical communication module 200.

Fourth Embodiment

Figure 4:
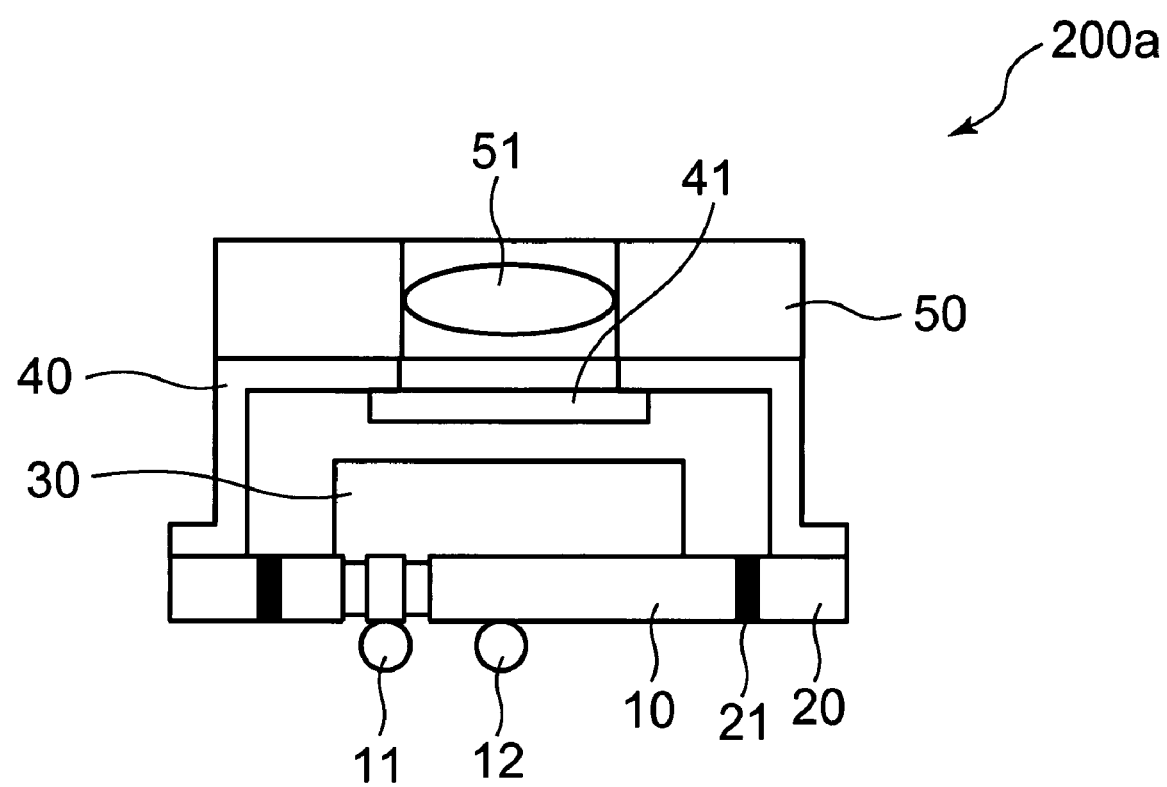
FIG. 4 illustrates a cross sectional view of an optical communication module in accordance with a fourth embodiment of the present invention.

Next, a description will be given of an optical communication module 200a in accordance with a fourth embodiment of the present invention. FIG. 4 illustrates a cross sectional view of the optical communication module 200a. The optical communication module 200a is different from the optical communication module 200 shown in FIG. 3 in a point that the lens holder 50 is fixed to upper side of the cap 40 and the leads 11 and 12 acting as a terminal is a bump having a spherical shape. The optical communication module 200a can be surface-mounted to a flexible substrate or the like when the terminal having the shape is used. In the embodiment, the lens holder 50 is fixed and electrically coupled to the second base portion 20 through the cap 40.

In the embodiment, when the lens holder 50 receives an external noise, the noise is possibly transmitted to the electronic component 100 through the cap 40. However, it is possible to restrain transmission of a noise from the lens holder 50 to the electronic component 100, because the first base portion 10 is insulated from the second base portion 20 with the insulating ring 21 and the lens holder 50 is fixed only to the second base portion 20 through the cap 40 without contacting to the first base portion 10. A transmission of an external noise from the electronic component 100 to outside is limited. Accordingly, it is possible to restrain error or breakdown of the optical communication module 200a.

It is possible to limit the noise transmission even if the module unit is electrically coupled to the second base portion 20 as is the case of the third and the fourth embodiments, because the first base portion 10 is insulated from the second base portion 20 with the insulating ring 21. The combination and the number of the optical component, the fixing member and so on in the module unit is optional.

Any terminal having another shape may be used, although the lead is used as a terminal in the first through the third embodiments. An electrode pad, a spherical conductor such as the bump in the fourth embodiment, a conductor having a pole shape may be used as a terminal. Other electronic elements such as a photo diode, a transistor for microwave and so on may be mounted, although the laser diode chip is mounted as an electronic element in each of the embodiments. Each of the base portions may have another shape if the first base portion 10 and the second base portion 20 are coupled to each other through an insulator, although each of the base portions has a cylindrical shape in each of the embodiments.

It is possible to reduce affection from external noise and a noise transmission to outside, when the present invention is adopted to an electronic component and an electronic component module. The electronic component and the electronic component module in accordance with the present invention are less subjected to the external noise, even if noise suppression of other components of the module is simplified.

While the above description constitutes the preferred embodiments of the present invention, it will be appreciated that the invention is susceptible of modification, variation and change without departing from the proper scope and fair meaning of the accompanying claims.

The present invention is based on Japanese Patent Application No. 2006-094033 filed on Mar. 30, 2006, the entire disclosure of which is hereby incorporated by reference.

What is claimed is:

1. An electronic component comprising:
   an electronic element mounting portion on which an electronic element is to be mounted;
   a first base portion on which the electronic element mounting portion is mounted, the first base portion being conductive;
   a second base portion that is conductive and surrounds the first base portion;
   a cap fixed only to the second base portion without contacting the first base portion;
   an insulator that insulates the first base portion from the second base portion and that couples the first base portion to the second base portion; and
   a terminal that is provided on the first base portion and that is insulated from the first base portion.

2. The electronic component as claimed in claim 1, wherein the first base portion is to be coupled to a ground potential or a reference potential.

3. The electronic component as claimed in claim 1, wherein the electronic element is an optical semiconductor element.

4. The electronic component as claimed in claim 1, wherein the insulator is made of glass or ceramics.

5. An electronic component module comprising:
   an electronic component that has an electronic element mounting portion, a first base portion, a second base portion, a terminal and an insulator,
   the first base portion and the second base portion being conductive,
   the second base portion surrounding the first base portion,
   a cap being fixed only to the second base portion without contacting the first base portion,
   an electronic element being to be mounted on the electronic element mounting portion,
   the electronic element mounting portion being mounted on the first base portion,
   the terminal being provided on the first base portion and being insulated from the first base portion,
   the insulator insulating the first base portion from the second base portion and coupling the first base portion to the second base portion; and
   a module unit that is directly or indirectly fixed only to the second base portion.

6. The electronic component module as claimed in claim 5, wherein the first base portion is to be coupled to a ground potential or a reference potential.

7. The electronic component module as claimed in claim 5, wherein the module unit is indirectly fixed to the second base portion through the cap.

8. The electronic component module as claimed in claim 5, wherein the electronic element is an optical semiconductor element.

* * * * *